(12) United States Patent
Song

(10) Patent No.: US 10,796,923 B2
(45) Date of Patent: Oct. 6, 2020

(54) POLYSILICON ETCHING METHOD

(71) Applicant: Wuhan China Star Optoelectronics Technology Co., Ltd., Wuhan, Hubei (CN)

(72) Inventor: Hongkun Song, Wuhan, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 398 days.

(21) Appl. No.: 15/745,132

(22) PCT Filed: Dec. 5, 2017

(86) PCT No.: PCT/CN2017/114613
§ 371 (c)(1),
(2) Date: Jan. 15, 2018

(87) PCT Pub. No.: WO2019/019516
PCT Pub. Date: Jan. 31, 2019

(65) Prior Publication Data
US 2019/0385864 A1    Dec. 19, 2019

(30) Foreign Application Priority Data

Jul. 24, 2017 (CN) .......................... 2017 1 0606790

(51) Int. Cl.
*H01L 21/3213* (2006.01)
*H01L 21/3065* (2006.01)

(52) U.S. Cl.
CPC .... *H01L 21/32137* (2013.01); *H01L 21/3065* (2013.01)

(58) Field of Classification Search
None
See application file for complete search history.

(56) References Cited

U.S. PATENT DOCUMENTS

| 4,255,230 | A | * | 3/1981 | Zajac | ............... | H01L 21/32137 |
| | | | | | | 204/192.32 |
| 4,472,237 | A | * | 9/1984 | Deslauriers | ....... | H01L 21/28061 |
| | | | | | | 148/DIG. 100 |
| 4,680,086 | A | * | 7/1987 | Thomas | ............ | H01L 21/32137 |
| | | | | | | 257/E21.312 |

(Continued)

FOREIGN PATENT DOCUMENTS

CN    1469438    1/2004

*Primary Examiner* — Allan W. Olsen
(74) *Attorney, Agent, or Firm* — Hemisphere Law, PLLC; Zhigang Ma

(57) ABSTRACT

The disclosure provides a polysilicon etching method, including the following steps: ionizing oxygen and/or ozone and fluorine-based gas to obtain a first etching gas having a plasma state, and etching a polysilicon coated by a photoresist with the first etching gas for a preset time; and ionizing the fluorine-based gas to obtain a second etching gas having a plasma state, and etching the polysilicon by the second etching gas until the polysilicon etching is completed. The disclosure can make the line width of the polysilicon smaller, reach the requirement of the preset line width, and can improve the angle of polysilicon to make the angle of polysilicon smaller and also make the loss of polysilicon line width smaller.

15 Claims, 2 Drawing Sheets

(56) References Cited

U.S. PATENT DOCUMENTS

| | | | | |
|---|---|---|---|---|
| 5,259,924 A * | 11/1993 | Mathews | H01L 21/31116 | 257/E21.252 |
| 5,453,156 A * | 9/1995 | Cher | H01L 21/32137 | 257/E21.312 |
| 5,629,235 A * | 5/1997 | Liu | H01L 21/28 | 257/E21.158 |
| 6,399,515 B1 * | 6/2002 | Tao | H01L 21/28123 | 257/E21.206 |
| 6,573,188 B1 * | 6/2003 | Lai | H01L 21/0335 | 257/E21.037 |
| 6,828,237 B1 * | 12/2004 | Chan | H01L 21/0338 | 257/E21.039 |
| 2001/0005622 A1 * | 6/2001 | Kim | H01L 21/28123 | 438/592 |
| 2002/0016044 A1 * | 2/2002 | Dreybrodt | H01L 21/32155 | 438/305 |
| 2003/0228760 A1 * | 12/2003 | Shiraishi | H01L 21/31116 | 438/689 |
| 2004/0260420 A1 * | 12/2004 | Ohno | G01N 21/211 | 700/121 |
| 2005/0208773 A1 * | 9/2005 | Huang | H01L 21/32139 | 438/719 |
| 2009/0258304 A1 * | 10/2009 | Yamada | H01L 21/31144 | 430/30 |
| 2012/0248067 A1 * | 10/2012 | Ogi | H01J 37/32779 | 216/71 |
| 2014/0299571 A1 * | 10/2014 | Sawataishi | C23F 4/00 | 216/17 |
| 2019/0386115 A1 * | 12/2019 | Lin | H01L 29/785 | |

* cited by examiner

POLYSILICON ETCHING METHOD

RELATED APPLICATIONS

The present application is a National Phase of International Application Number PCT/CN2017/114613, filed Dec. 5, 2017, and claims the priority of China Application No. 201710606790.1, filed Jul. 24, 2017.

FIELD OF THE DISCLOSURE

The present invention relates to the technical field of polysilicon, and in particular to a polysilicon etching method.

BACKGROUND

At present, when the polysilicon is etched by the dry etching method, the polysilicon is placed in the plasma reactor. During the etching process, the process gas used is generally pure chlorine. The flow rate of the chlorine gas introduced into the plasma reactor is about 2000 sccm. After the plasma reactor ionized chlorine to generate the chloride ions, chloride ions mainly physically attack polysilicon in the vertical direction, but have little chemical reaction with polysilicon, so there is less etching on the polysilicon side, thus the angle of polysilicon (the taper angle of the polysilicon planarization layer, i.e., the taper angle) more depends on the photolithography process on the surface of the polysilicon.

When the polysilicon is etched by the above method, the angle of the polysilicon after etching is steeper, resulting in poor coverage of the underlayer film on the polysilicon surface, which may cause the film of the underlayer film to break, thereby affecting the product characteristics. As the line width of the polysilicon gets thinner and thinner, and the loss of line width is less and less demanding, the dry etching needs to improve the manufacturing process to improve the angle of polysilicon so that the angle of polysilicon becomes smaller.

SUMMARY

In order to solve the above technical problem, the disclosure provides a polysilicon etching method, which can improve the angle of polysilicon and make the angle of polysilicon smaller.

The disclosure provides a polysilicon etching method, including the following steps:

S1: ionizing oxygen and/or ozone and fluorine-based gas to obtain a first etching gas having a plasma state, and etching the polysilicon coated by a photoresist with the first etching gas for a preset time;

S2: ionizing the fluorine-based gas to obtain a second etching gas having a plasma state, and etching the polysilicon by the second etching gas until the polysilicon etching is completed.

Preferably, the step S1 includes:

placing the polysilicon coated by the photoresist in a plasma reactor and introducing the oxygen and/or ozone, and fluorine-based gas into the plasma reactor, and turning on an excitation power of the plasma reactor to ionize the oxygen and/or ozone and the fluorine-based gas to obtain the first etching gas; and turning on a bias power supply of the plasma reactor and controlling the first etching gas to etch the polysilicon for the preset time.

Preferably, after the step S1, the method further includes:

turning off the excitation power supply and the bias power supply and stopping a flow of the oxygen and/or ozone, and the fluorine-based gas into the plasma reactor; and withdrawing a residual gas in the plasma reactor.

The step S2 further includes:

introducing chlorine gas into the plasma reactor, turning on the excitation power and ionizing the chlorine gas to obtain the second etching gas; and turning on the bias power supply and controlling the second etching gas to etch the polysilicon until the polysilicon etching is completed.

Preferably, the following steps are further included:

monitoring a spectrum excited by the reactants of the polysilicon to determine whether the polysilicon is etched or not.

Preferably, an output power ratio of the excitation power source and the bias power source ranges from ½ to ⅔.

Preferably, the fluorine-based gas includes at least one of sulfur hexafluoride $SF_6$ and carbon tetrafluoride $CF_4$.

Preferably, the preset time is set according to a preset line width of the polysilicon.

Preferably, an output power of the excitation power supply ranges from 3 kw to 20 kw.

The disclosure further provides a polysilicon etching method, including the following steps:

S1: ionizing t and fluorine-based gas to obtain a first etching gas having a plasma state, and etching the polysilicon coated by a photoresist with the first etching gas for a preset time;

S2: ionizing the fluorine-based gas to obtain a second etching gas having a plasma state, and etching the polysilicon by the second etching gas until the polysilicon etching is completed;

The step S1 includes:

placing the polysilicon coated by the photoresist in a plasma reactor and introducing the oxygen and/or ozone, and fluorine-based gas into the plasma reactor, and turning on an excitation power of the plasma reactor to ionize the oxygen and/or ozone and the fluorine-based gas to obtain the first etching gas; and turning on a bias power supply of the plasma reactor and controlling the first etching gas to etch the polysilicon for the preset time;

after the step S1, the method further includes:

turning off the excitation power supply and the bias power supply and stopping a flow of the oxygen and/or ozone, and the fluorine-based gas into the plasma reactor; and withdrawing a residual gas in the plasma reactor.

Preferably, the step S2 further includes:

introducing chlorine gas into the plasma reactor, turning on the excitation power and ionizing the chlorine gas to obtain the second etching gas;

turning on the bias power supply and controlling the second etching gas to etch the polysilicon until the polysilicon etching is completed.

Preferably, the following steps are further included:

monitoring a spectrum excited by the reactants of the polysilicon to determine whether the polysilicon is etched or not.

Preferably, the output power ratio of the excitation power source and the bias power source ranges from ½ to ⅔.

Preferably, the fluorine-based gas includes at least one of sulfur hexafluoride $SF_6$ and carbon tetrafluoride $CF_4$.

Preferably, the preset time is set according to a preset line width of the polysilicon.

Preferably, an output power of the excitation power supply ranges from 3 kw to 20 kw.

The disclosure further provides a polysilicon etching method, including the following steps:

S1: ionizing oxygen and/or ozone and fluorine-based gas to obtain a plasma-state first etching gas, and etching the polysilicon coated by a photoresist with the first etching gas for a preset time;

S2: ionizing the fluorine-based gas to obtain a second etching gas having a plasma state, and etching the polysilicon by the second etching gas until the polysilicon etching is completed;

The step S1 includes:

placing the polysilicon coated by the photoresist in a plasma reactor and introducing the oxygen and/or ozone, and fluorine-based gas into the plasma reactor, and turning on an excitation power of the plasma reactor to ionize the oxygen and/or ozone and the fluorine-based gas to obtain the first etching gas; and turning on a bias power supply of the plasma reactor and controlling the first etching gas to etch the polysilicon for the preset time;

The step S2 further includes:

introducing chlorine gas into the plasma reactor, turning on the excitation power and ionizing the chlorine gas to obtain the second etching gas;

turning on the bias power supply and controlling the second etching gas to etch the polysilicon until the polysilicon etching is completed.

Preferably, after the step S1, the method further includes:

turning off the excitation power supply and the bias power supply and stopping a flow of the oxygen and/or ozone, and the fluorine-based gas into the plasma reactor; and withdrawing a residual gas in the plasma reactor.

Preferably, the following steps are further included:

monitoring a spectrum excited by the reactants of the polysilicon to determine whether the polysilicon is etched or not;

The output power ratio of the excitation power source and the bias power source ranges from ½ to ⅔;

the fluorine-based gas includes at least one of sulfur hexafluoride $SF_6$ and carbon tetrafluoride $CF_4$; and the preset time is set according to a preset line width of the polysilicon.

Preferably, an output power of the excitation power supply ranges from 3 kw to 20 kw.

The embodiment of the disclosure has the following advantageous effects: by etching the polysilicon coated by a photoresist with ionized oxygen and/or ozone, and fluorine-based gas, and using the characteristics that fluoride ions not only can perform etching of polysilicon in the vertical direction, but also can performing side etching of polysilicon, the line width of the polysilicon may be small, the line width reaches the preset requirement, and the side etching of the polysilicon by fluorine ions can reduce the angle of polysilicon, so that the polysilicon angle becomes smaller, and the underlayer film covering the polysilicon surface is also not easily broken. The ionized chlorine is mainly physically bombarded with polysilicon in the vertical direction. Therefore, the polysilicon can be finally etched by ionized chlorine gas to reach the final product requirement, so that the loss of polysilicon line width can be made smaller.

BRIEF DESCRIPTION OF THE DRAWINGS

In order to illustrate technical schemes of the disclosure or the prior art more clearly, the following section briefly introduces drawings used to describe the embodiments and prior art. Obviously, the drawing in the following descriptions is just some embodiments of the disclosure. The ordinary person in the related art can acquire the other drawings according to these drawings without offering creative effort.

DETAILED DESCRIPTION OF PREFERRED EMBODIMENTS

Figure 1:
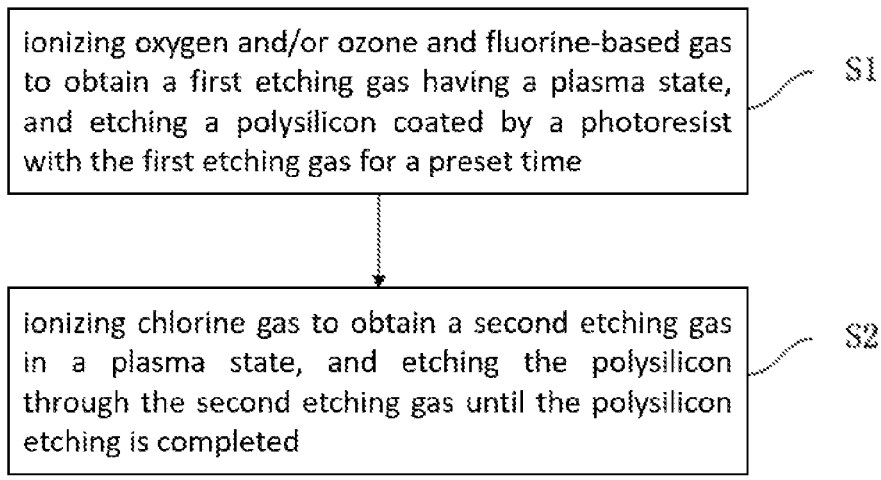
FIG. 1 is a flow chart of a polysilicon etching method provided by the disclosure.

The polysilicon etching method provided by the disclosure, as shown in FIG. 1, includes the following steps:

S1: ionizing oxygen and/or ozone and fluorine-based gas to obtain a plasma-state first etching gas, and etching the polysilicon coated by a photoresist with the first etching gas for a preset time; for example, a mixed gas of oxygen gas and the fluorine-based gas is ionized to obtain a first etching gas, or a mixed gas of ozone and the fluorine-based gas is ionized to obtain a first etching gas, it may also ionize the mixed gas composed of oxygen, ozone and the fluorine-based gas to obtain a first etching gas.

S2: ionizing the fluorine-based gas to obtain a second etching gas having a plasma state, and etching the polysilicon by the second etching gas until the polysilicon etching is completed.

Figure 2A:
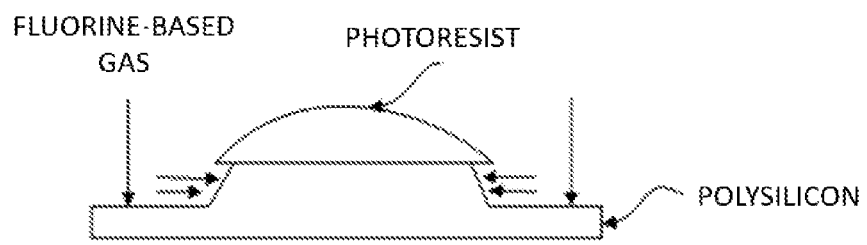
FIG. 2a is a schematic diagram of polysilicon etching by fluorine gas according to the polysilicon etching method provided by the disclosure.

The fluorine-based gas is a fluorine-containing gas, and may be $SF_6$, which is used to react with polysilicon, as shown in FIG. 2a, the fluorine gas performs a physical bombardment and side etching to the polysilicon.

The photoresist is mainly composed of carbon (C), hydrogen (H), oxygen (O) compounds $C_xH_yO_z$, the reaction formula of $SF_6$ and polysilicon is as follows:

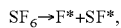

$$SF_6 \rightarrow F^* + SF^*,$$

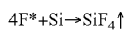

$$4F^* + Si \rightarrow SiF_4 \uparrow$$

The reaction of oxygen and photoresist is as follows:

$$O_2 \rightarrow 2O^*;$$

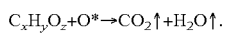

$$C_xH_yO_z + O^* \rightarrow CO_2 \uparrow + H_2O \uparrow.$$

In a plasma reactor, after the plasma performs ionization to $SF_6$, the generated $F^*$ can perform side etching to polysilicon to improve the angle of polysilicon, so the angle of polysilicon becomes smaller; after the plasma performs ionization to oxygen, the photoresist can be modified by the generated O2.

Among them, in the plasma reactor, chlorine is firstly ionized into chloride ions and then chloride ions react with polysilicon, and the specific reaction formula is as follows:

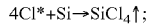

Figure 2B:
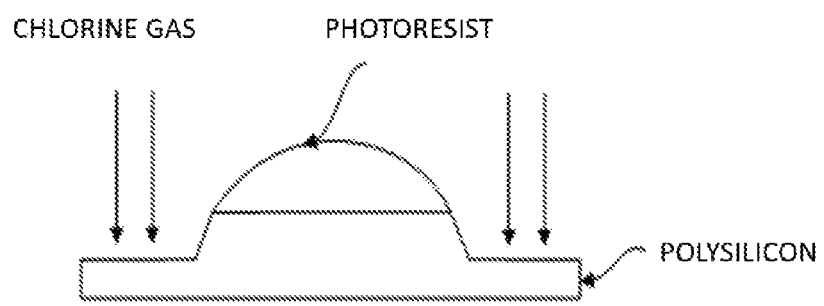
FIG. 2b is a schematic diagram of polysilicon etching by chlorine gas according to the polysilicon etching method provided by the disclosure.
Figure 3A:
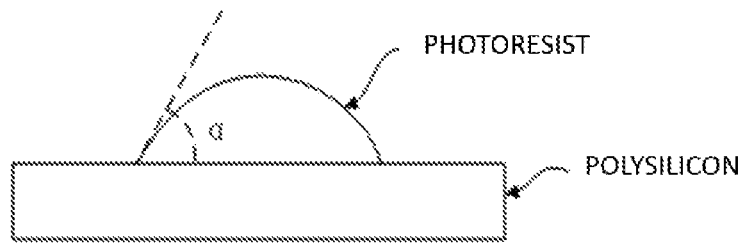
FIG. 3a is a schematic diagram of polysilicon before etching of the polysilicon etching method provided by the disclosure.
Figure 3B:
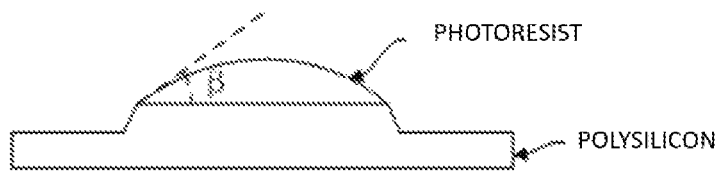
FIG. 3b is a schematic view of the polysilicon in the etching of the polysilicon etching method provided by the disclosure.
Figure 3C:
FIG. 3c is a schematic view of the polysilicon after etching of the polysilicon etching method provided by the disclosure.
Figure 3D:
FIG. 3d is a schematic diagram of the etched polysilicon surface covering underlayer film of the polysilicon etching method provided by the disclosure.

After polysilicon etching is complete, the $SiCl_4$ gas generated by plasma reactor can be withdrawn. It should be noted that there is less chemical reaction between the ionized chlorine gas and the polysilicon. Therefore, it also has less side-etching on the polysilicon, so the loss of the line width is also less; as shown in FIG. 2b, the ionized chlorine mainly performs a physical bombardment of polysilicon in the vertical direction.

As shown in FIGS. 3a, 3b, 3c, and 3d, before etching, the angle of polysilicon (the taper angle of the polysilicon planarization layer, that is, the taper angle) is α and the angle of polysilicon during etching is β and β<α; After etching, the angle of polysilicon is γ, which is slightly smaller than the angle of polysilicon that is etched by using ionized chlorine gas throughout the entire process, thereby covering the polysilicon surface of the underlying film is not easy to break.

Further, the step S1 includes:

placing the polysilicon coated by the photoresist in a plasma reactor and introducing oxygen and/or ozone, and fluorine-based gas into the plasma reactor, and turning on an excitation power of the plasma reactor to ionize oxygen and/or ozone and the fluorine-based gas to obtain the first etching gas. The gas pressure in the plasma reactor ranges from about 0.1 Pa to 100 Pa, and the gas inside the plasma reactor is ionized to a plasma state by a high-frequency power source (e.g., 13.56 MHz).

turning on a bias power supply of the plasma reactor and controlling the first etching gas to etch the polysilicon for the preset time; it should be noted that the bias power supply and the excitation power supply can be turned on at the same time, or the excitation power supply can be turned on again.

Further, after the step S1, the following steps are further included:

turning off the excitation power supply and the bias power supply and stopping a flow of the oxygen and/or ozone, and the fluorine-based gas into the plasma reactor; and withdrawing a residual gas in the plasma reactor. For example, the mixed gas of $SiF_4$, $CO_2$, and $H_2O$.

The step S2 further includes:

introducing chlorine gas into the plasma reactor, turning on the excitation power and ionizing the chlorine gas to obtain the second etching gas.

turning on the bias power supply and controlling the second etching gas to etch the polysilicon until the polysilicon etching is completed, ensuring there is no excess polysilicon residue. The amount of chlorine into the polysilicon needs to be based on the amount of etching to decide.

Further, the polysilicon etching method further includes the following steps:

monitoring a spectrum excited by the reactants of the polysilicon to determine whether the polysilicon is etched or not. For example, a spectrum excited by $SiCl_4$ is received with a spectral receiver, when the etching is completed, $SiCl_4$ is gradually diminished, the spectrum excited by $SiCl_4$ is gradually weakened, according to monitoring $SiCl_4$ excited by the spectrum, whether the polysilicon is etched completely or not can be determined.

Further, the output power ratio of the excitation power source and the bias power source ranges from ½ to ⅔. For example, the output power ratio of the excitation power source to the bias power source may be ½ or ⅔.

Generally speaking, the output power of the bias power source is higher than the output power of the excitation power source, by increasing the output power of the bias power supply can increase the side etching of the polysilicon by the gas inside the plasma reactor, so that the angle of polysilicon is smaller.

Further, the fluorine-based gas includes at least one of sulfur hexafluoride $SF_6$ and carbon tetrafluoride $CF_4$.

Further, a preset time corresponding to the polysilicon etching by the first etching gas is set according to a preset line width of the polysilicon. Specifically, the amount of polysilicon needed to be etched can be calculated based on the preset line width of the polysilicon, and the time required for etching (that is, preset time) can be calculated according to the content and the reaction efficiency of the fluorine-based gas to be etched in the plasma reactor; the fluoride gas can choose a mixed gas of any one or two components of $SF_6$ and $CF_4$, and the time required to etch polysilicon by $SF_6$ and $CF_4$ is not the same.

Further, an output power of the excitation power supply ranges from 3 kw to 20 kw.

To sum up, in the disclosure, oxygen and/or ozone, and the fluorine-based gas are introduced into the plasma reactor, after oxygen and/or ozone and the fluorine-based gas are ionized, fluorine ions and oxygen ions are generated, fluoride ions can perform etching of polysilicon in the vertical direction, but also in the lateral etching of polysilicon, the line width of the polysilicon may be small, the line width reaches the preset requirement, and the side etching of the polysilicon by fluorine ions can reduce the angle of polysilicon, so that the polysilicon angle becomes smaller, and the underlayer film covering the polysilicon surface is also not easily broken; the ionized chlorine is then used to etch the polysilicon to reach the final product demand, chloride ions mainly physically attack polysilicon in the vertical direction, which can make the loss of the line width of polysilicon smaller.

Disclosures above is a further detailed description of the disclosure in conjunction with specific alternative embodiments, and the specific embodiments of the disclosure should not be construed as being limited to this description. It will be apparent to those skilled in the art from this disclosure that various modifications or substitutions may be made without departing from the spirit of the disclosure and are intended to be within the scope of the disclosure.

What is claimed is:

1. A polysilicon etching method, comprising the following steps:
   S1: ionizing oxygen and/or ozone, and fluorine-based gas to obtain a first etching gas having a plasma state, and etching a polysilicon coated by a photoresist with the first etching gas for a preset time;
   S2: ionizing chlorine gas to obtain a second etching gas in a plasma state, and etching the polysilicon through the second etching gas until the polysilicon etching is completed;
   wherein the step S1 comprises:
      placing the polysilicon coated by the photoresist in a plasma reactor and introducing oxygen and/or ozone, and the fluorine-based gas into the plasma reactor, and turning on an excitation power supply of the plasma reactor to ionize the oxygen and/or ozone, and the fluorine-based gas to obtain the first etching gas; and turning on a bias power supply of the plasma reactor and controlling the first etching gas to etch the polysilicon for the preset time;

wherein an output power ratio of the excitation power supply and the bias power supply ranges from ½ to ⅔.

2. The polysilicon etching method according to claim 1, wherein after the step S1 further comprises:
turning off the excitation power supply and the bias power supply and stopping a flow of the oxygen and/or ozone, and the fluorine-based gas into the plasma reactor; and withdrawing a residual gas in the plasma reactor.

3. The polysilicon etching method according to claim 1, wherein the step S2 further comprises:
introducing chlorine gas into the plasma reactor, turning on the excitation power supply and ionizing the chlorine gas to obtain the second etching gas;
turning on the bias power supply and controlling the second etching gas to etch the polysilicon until the polysilicon etching is completed.

4. The polysilicon etching method according to claim 3, further comprising the following steps:
monitoring a spectrum excited by reactants of the polysilicon to determine whether the polysilicon is etched or not.

5. The polysilicon etching method according to claim 3, wherein the fluorine-based gas includes at least one of sulfur hexafluoride $SF_6$ and carbon tetrafluoride $CF_4$.

6. The polysilicon etching method according to claim 3, wherein the preset time is set according to a preset line width of the polysilicon.

7. The polysilicon etching method according to claim 1, wherein an output power of the excitation power supply ranges from 3 kw to 20 kw.

8. A polysilicon etching method, comprising the following steps:
S1: ionizing oxygen and/or ozone, and fluorine-based gas to obtain a first etching gas having a plasma state, and etching a polysilicon coated by a photoresist with the first etching gas for a preset time;
S2: ionizing a fluorine-based gas to obtain a second etching gas having a plasma state, and etching the polysilicon by the second etching gas until the polysilicon etching is completed;
wherein the step S1 comprises:
placing the polysilicon coated by the photoresist in a plasma reactor and introducing oxygen and/or ozone, and fluorine-based gas into the plasma reactor, and turning on an excitation power supply of the plasma reactor to ionize oxygen and/or ozone, and the fluorine-based gas to obtain the first etching gas; and
turning on a bias power supply of the plasma reactor and controlling the first etching gas to etch the polysilicon for the preset time;
wherein after the step S1, the method further comprises:
turning off the excitation power supply and the bias power supply and stopping a flow of the oxygen and/or ozone, and the fluorine-based gas into the plasma reactor; and
withdrawing a residual gas in the plasma reactor;
wherein the step S2 further comprises:
introducing chlorine gas into the plasma reactor, turning on the excitation power supply and ionizing the chlorine gas to obtain the second etching gas; and
turning on the bias power supply and controlling the second etching gas to etch the polysilicon until the polysilicon etching is completed;
wherein an output power ratio of the excitation power supply and the bias power supply ranges from ½ to ⅔.

9. The polysilicon etching method according to claim 8, further comprising the following steps:
monitoring a spectrum excited by reactants of the polysilicon to determine whether the polysilicon is etched or not.

10. The polysilicon etching method according to claim 8, wherein the fluorine-based gas includes at least one of sulfur hexafluoride $SF_6$ and carbon tetrafluoride $CF_4$.

11. The polysilicon etching method according to claim 8, wherein the preset time is set according to a preset line width of the polysilicon.

12. The polysilicon etching method according to claim 8, wherein an output power of the excitation power supply ranges from 3 kw to 20 kw.

13. A polysilicon etching method, comprising the following steps:
S1: ionizing oxygen and/or ozone, and fluorine-based gas to obtain a first etching gas having a plasma state, and etching a polysilicon coated by a photoresist with the first etching gas for a preset time;
S2: ionizing the fluorine-based gas to obtain a second etching gas having a plasma state, and etching the polysilicon by the second etching gas until the polysilicon etching is completed;
wherein the step S1 comprises:
placing the polysilicon coated by the photoresist in a plasma reactor and introducing the oxygen and/or ozone, and the fluorine-based gas into the plasma reactor, and turning on an excitation power of the plasma reactor to ionize the oxygen and/or ozone, and the fluorine-based gas to obtain the first etching gas; and
turning on a bias power supply of the plasma reactor and controlling the first etching gas to etch the polysilicon for the preset time;
the step S2 further comprises:
introducing chlorine gas into the plasma reactor, turning on the excitation power supply and ionizing the chlorine gas to obtain the second etching gas; and
turning on the bias power supply and controlling the second etching gas to etch the polysilicon until the polysilicon etching is completed;
wherein the polysilicon etching method further comprises:
monitoring a spectrum excited by reactants of the polysilicon to determine whether the polysilicon is etched or not;
an output power ratio of the excitation power supply and the bias power supply ranges from ½ to ⅔;
the fluorine-based gas includes at least one of sulfur hexafluoride $SF_6$ and carbon tetrafluoride $CF_4$; and
the preset time is set according to a preset line width of the polysilicon.

14. The polysilicon etching method according to claim 13, wherein after the step S1 further comprises:
turning off the excitation power supply and the bias power supply and stopping a flow of the oxygen and/or ozone, and the fluorine-based gas into the plasma reactor; and
withdrawing a residual gas in the plasma reactor.

15. The polysilicon etching method according to claim 13, wherein an output power of the excitation power supply ranges from 3 kw to 20 kw.

* * * * *